(12) United States Patent
Hayashida et al.

(10) Patent No.: US 11,488,896 B2
(45) Date of Patent: Nov. 1, 2022

(54) SEMICONDUCTOR DEVICE

(71) Applicant: Mitsubishi Electric Corporation, Tokyo (JP)

(72) Inventors: Yukimasa Hayashida, Tokyo (JP); Shigeru Hasegawa, Tokyo (JP); Ryo Tsuda, Tokyo (JP); Ryutaro Date, Tokyo (JP); Junichi Nakashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 15/742,588

(22) PCT Filed: Sep. 28, 2015

(86) PCT No.: PCT/JP2015/077271
§ 371 (c)(1),
(2) Date: Jan. 8, 2018

(87) PCT Pub. No.: WO2017/056144
PCT Pub. Date: Apr. 6, 2017

(65) Prior Publication Data
US 2018/0197813 A1   Jul. 12, 2018

(51) Int. Cl.
*H01L 23/495* (2006.01)
*H01L 25/065* (2006.01)
(Continued)

(52) U.S. Cl.
CPC ........ *H01L 23/49541* (2013.01); *H01L 23/50* (2013.01); *H01L 24/69* (2013.01);
(Continued)

(58) Field of Classification Search
CPC ........... H01L 23/4952; H01L 23/49575; H01L 23/4334; H01L 23/49541; H01L 23/50; H01L 24/69; H01L 25/0655
See application file for complete search history.

(56) References Cited

U.S. PATENT DOCUMENTS 8,237,065 B2 * 8/2012 Ishida .................... H01L 24/40
174/520
8,610,263 B2   12/2013 Hino et al.
(Continued)

FOREIGN PATENT DOCUMENTS

JP   2005-012053 A   1/2005
JP   2008016529 A *  1/2008 ............ H01L 24/36
JP   2011-155088 A   8/2011

OTHER PUBLICATIONS

Star Fruits S.N.C. v. U.S., 393 F.3d 1277 (Fed. Cir. 2005) (Year: 2005).*

(Continued)

*Primary Examiner* — Vincent Wall
(74) *Attorney, Agent, or Firm* — Studebaker & Brackett PC

(57) ABSTRACT

An object is to provide a technique capable of enhancing electrical characteristics and reliability of a semiconductor device. The semiconductor device includes a plurality of semiconductor chips, a plurality of electrodes each being electrically connected to each of the plurality of semiconductor chips, a sealing member, and a joint part. The sealing member covers the plurality of semiconductor chips, and parts being connected to the plurality of semiconductor chips, of the plurality of electrodes. The joint part is disposed outside the sealing member to electrically connect parts which are not covered by the sealing member, of the plurality of electrodes.

17 Claims, 7 Drawing Sheets

(51) Int. Cl.
  *H01L 23/50* (2006.01)
  *H01L 23/00* (2006.01)
(52) U.S. Cl.
  CPC .... *H01L 25/0655* (2013.01); *H01L 23/49555* (2013.01); *H01L 2924/15* (2013.01); *H01L 2924/181* (2013.01)

(56) References Cited

U.S. PATENT DOCUMENTS

| | | | | |
|---|---|---|---|---|
| 8,847,408 | B2* | 9/2014 | Lin | H01L 23/49562 257/777 |
| 2004/0004272 | A1* | 1/2004 | Luo | H01L 23/49575 257/666 |
| 2004/0113258 | A1* | 6/2004 | Yamada | H01L 23/488 257/691 |
| 2005/0151236 | A1* | 7/2005 | Oliver | H01L 23/49575 257/685 |
| 2006/0151868 | A1* | 7/2006 | Zhu | H01L 24/49 257/690 |
| 2006/0255362 | A1* | 11/2006 | Otremba | H01L 23/4952 257/177 |
| 2007/0215996 | A1* | 9/2007 | Otremba | H01L 23/4334 257/678 |
| 2009/0057929 | A1 | 3/2009 | Sasaki et al. | |
| 2015/0138733 | A1* | 5/2015 | Tsuda | H01L 23/49811 361/733 |

OTHER PUBLICATIONS

Merriam Webster dictionary definition of taper, https://www.merriam-webster.com/dictionary/tape (Year: 2021).*
JP-2008016529-A machine translation (Year: 2022).*
Notification Concerning Transmittal of International Preliminary Report on Patentability (Chapter I) and Translation of Written Opinion of the International Searching Authority; PCT/JP2015/077271; dated Apr. 12, 2018.
International Search Report issued in PCT/JP2015/077271; dated Dec. 1, 2015.
An Office Action issued by the China National Intellectual Property Administration dated Jul. 15, 2020, which corresponds to Chinese Patent Application No. 201580083447.2 and is related to U.S. Appl. No. 15/742,588. with English language translation.
An Office Action issued by the German Patent Office dated Jul. 1, 2020, which corresponds to German Patent Applicatior No. 112015006979.8 and is related to U.S. Appl. No. 15/742,588; with English language translation.

* cited by examiner

F I G. 7
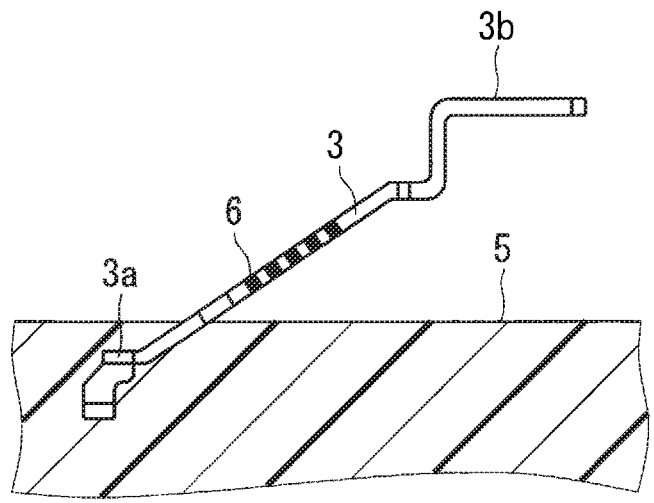
F I G. 8
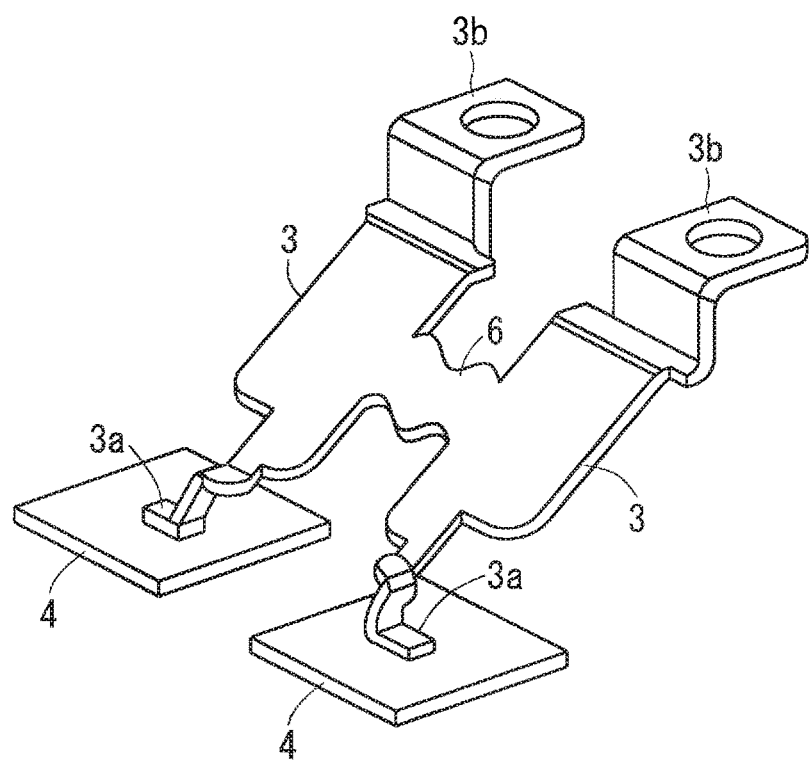

SEMICONDUCTOR DEVICE

TECHNICAL FIELD

The present invention relates to a semiconductor device in which semiconductor chips are covered by a sealing member.

BACKGROUND ART

Proposed is a semiconductor device in which a plurality of semiconductor chips are covered by a package (a sealing member) (for example, Patent Document 1).

PRIOR ART DOCUMENTS

Patent Documents

Patent Document 1: Japanese Patent Application Laid-Open No. 2005-12053

SUMMARY

Problem to be Solved by the Invention

Since capacity (current) in such a semiconductor device is increasing, it is required to operate a large number of semiconductor chips in the package evenly and parallelly. As a result, it is desired to flow current evenly in each semiconductor chip and therefore adjust potentials of insulating substrates which mount the semiconductor chips. It is also desired to reduce an electrical oscillation (an oscillation) due to an unbalance of the potentials.

Furthermore, a configuration of adopting a resin such as a silicone gel to the package has a problem that expansion force of the resin in high temperature generates a negative influence on an electrical connection between the semiconductor chip and an electrode, thereby reducing a lifetime of the device.

The present invention therefore has been made to solve the above-mentioned problems and an object of the present invention is to provide a technique capable of enhancing electrical characteristics and reliability of a semiconductor device.

Means to Solve the Problem

A semiconductor device according to the present invention includes a plurality of semiconductor chips, a plurality of electrodes each being electrically connected to each of the plurality of semiconductor chips, a sealing member covering the plurality of semiconductor chips and parts being connected to the plurality of semiconductor chips, of the plurality of electrodes, and a joint part disposed outside the sealing member to electrically connect parts which are not covered by the sealing member, of the plurality of electrodes. The plurality of electrodes and the joint part are made up of a single member.

Effects of the Invention

According to the present invention, provided is the joint part disposed outside the sealing member to electrically connect parts which are not covered by the sealing member, of the plurality of electrodes. Accordingly, the electrical characteristics and reliability of the semiconductor device can be enhanced.

These and other objects, features, aspects and advantages of the present invention will become more apparent from the following detailed description of the present invention when taken in conjunction with the accompanying drawings.

BRIEF DESCRIPTION OF DRAWINGS

FIG. 7 A diagram of the configuration of the part of the semiconductor device according to the modification example seen from a side part of an electrode.

FIG. 8 A perspective view illustrating a configuration of a part of a semiconductor device according to a modification example.

DESCRIPTION OF EMBODIMENT(S)

Embodiment 1

Described firstly is a semiconductor device relating to a semiconductor device according to the embodiment 1 of the present invention (referred to "the related semiconductor device" hereinafter) before the semiconductor device according to the embodiment 1 is described.

Figure 1:
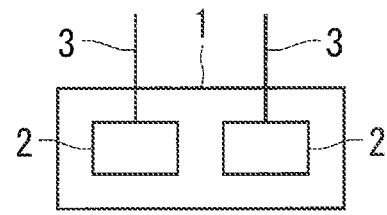
FIG. 1 A plan view schematically illustrating a configuration of a part of a related semiconductor device.

FIG. 1 is a plan view schematically illustrating a configuration of a part of the related semiconductor device. The related semiconductor device in FIG. 1 includes an insulating substrate 1, a plurality of semiconductor chips 2, and a plurality of electrodes 3.

The plurality of semiconductor chips 2 is mounted on the insulating substrate 1. In the description hereinafter, the number of the plurality of semiconductor chips 2 are two, however, three or more is also applicable as matter of course. The semiconductor chips 2 may include a semiconductor made of silicon, or may include a wide band gap semiconductor made of silicon carbide, gallium nitride, or diamond, for example.

Figure 2:
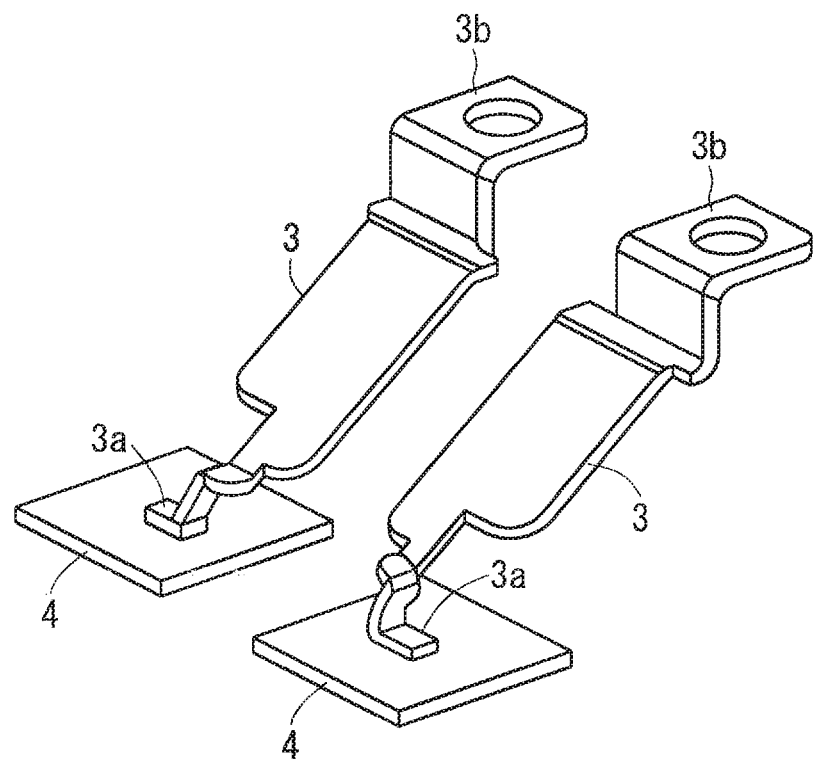
FIG. 2 A perspective view illustrating a configuration of a part of the related semiconductor device.

Each of the plurality of electrodes 3 is electrically connected to each of the plurality of semiconductor chips 2. FIG. 2 is a perspective view illustrating a configuration of a part of the related semiconductor device (a peripheral part of the electrodes 3). In the description hereinafter, the electrode 3 is electrically connected to the semiconductor chip 2 (not shown in FIG. 2) via a metal member such as a connection part 4 provided on the insulating substrate 1, for example. However, the configuration is not limited thereto, but the electrode 3 may be directly connected to the semiconductor chip 2, for example.

The electrode 3 has substantially a long-plate shape. One end portion 3a of the electrode 3 in a longitudinal direction has a tapered shape, and is connected to the connection part 4. The other end portion 3b of the electrode 3 in the longitudinal direction has a through hole, and is connected to an electrical component such as a bus bar or a capacitor (not shown).

Figure 3:
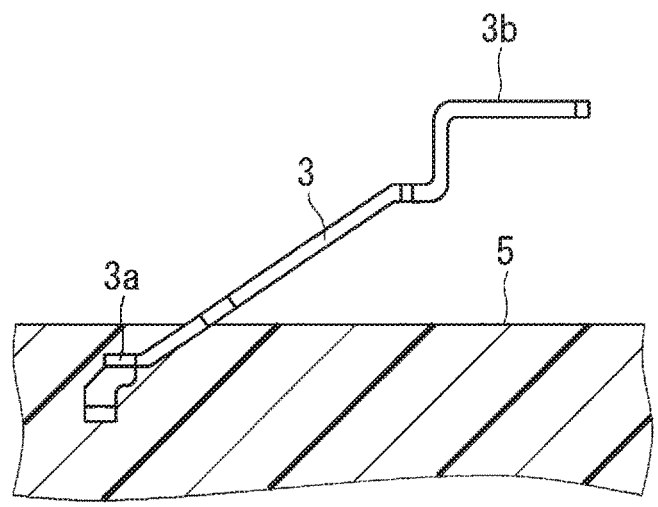
FIG. 3 A diagram of the configuration of the part of the related semiconductor device seen from a side part of an electrode.

FIG. 3 is a diagram of the configuration of the part of the related semiconductor device (the peripheral part of the electrodes 3) seen from a side part of the electrode 3 having substantially the long-plate shape. The related semiconductor device includes a sealing ember 5 made of a resin such as a silicone gel, for example. The sealing member 5 has a configuration of covering the plurality of semiconductor chips 2 (not shown in FIG. 3) and the parts being connected to the plurality of semiconductor chips 2 (one end portions 3a), of the plurality of electrodes 3.

Since the plurality of electrodes 3 are insulated from each other in the related semiconductor device having the above configuration, there is a problem that current cannot flow in the plurality of semiconductor chips 2 evenly and parallelly. Moreover, an unbalance of potentials in the plurality of electrodes 3 is relatively large, so that there is a problem that an electrical oscillation due to the unbalance is relatively large.

In the meanwhile, the semiconductor device according to the present embodiment 1 described hereinafter is capable of solving those problems. The same reference numerals as those described in the embodiment 1 will be assigned to the same or similar constituent element described in the description hereinafter, and the different constituent elements are mainly described.

Figure 4:
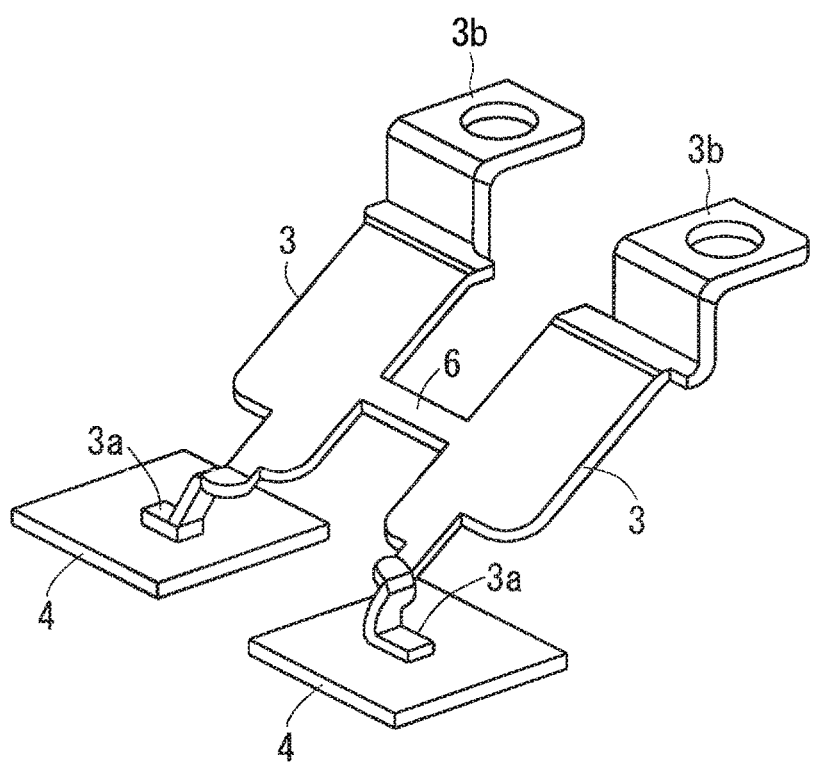
FIG. 4 A perspective view illustrating a configuration of a part of a semiconductor device according to an embodiment 1.
Figure 5:
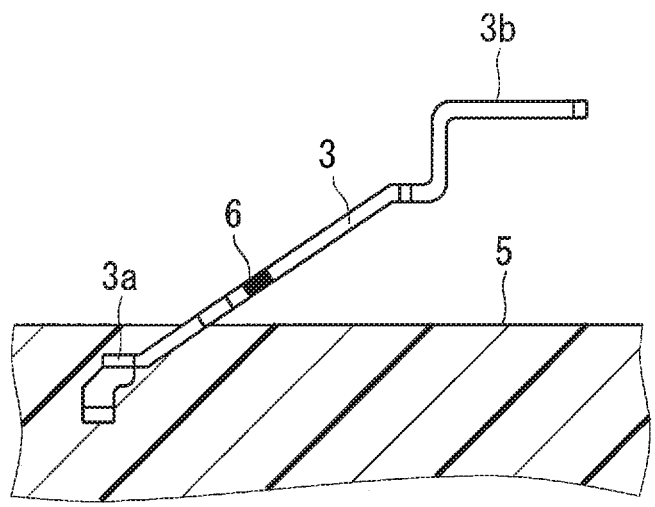
FIG. 5 A diagram of the configuration of the part of the semiconductor device according to the embodiment 1 seen from a side part of an electrode.

FIG. 4 is a perspective view illustrating a configuration of a part of the semiconductor device according to the present embodiment 1, and FIG. 5 is a drawing of the configuration of the part of the semiconductor device seen from a side part of the electrode 3. FIG. 4 and FIG. 5 correspond to FIG. 2 and FIG. 3, respectively. The semiconductor device according to the present embodiment 1 includes a joint part 6. The joint part 6 cannot be actually seen from the side part of the electrode 3, however, joint part 6 is indicated by a region filled in black color for convenience in FIG. 5 and the subsequent drawings similar to FIG. 5.

The joint part 6 electrically connects parts which are not covered by the sealing member 5, of the plurality of electrodes 3. In the present embodiment 1, the joint part 6 is located between two adjacent electrodes 3 to connect the two adjacent electrodes 3. The joint part 6 has a long-plate shape (flat-plate shape), and a surface of the joint part 6 and a surface of the electrode 3 form one flat surface as illustrated in FIG. 5. The electrode 3 and the joint part 6 having such a configuration can be formed by a press working, for example.

The joint part 6 is disposed above the sealing member 5. However, the configuration of the joint part 6 is not limited thereto, but any configuration is applicable as long as the joint part 6 is disposed outside the sealing member 5.

In the semiconductor device according to the present embodiment 1 having such a configuration, the joint part 6 electrically connects the plurality of electrodes 3. According to such a configuration, the potentials of the plurality of electrodes 3 are equalized, thus an amount of current flowing into the metal member such as the connection part 4 located on the insulating substrate 1 and flowing into the plurality of semiconductor chips 2 can be equalized. That is to say, a branch current can be improved. The unbalance of the potentials in the plurality of electrodes 3 can be suppressed, thus the effect of suppressing the electrical oscillation can also be expected. Accordingly, the electrical characteristics of the semiconductor device can be enhanced.

Assumed herein is a configuration that the joint part 6 is located in the sealing member 5 as a different configuration from that of the present embodiment 1. In such a configuration, when the sealing member 5 expands, expansion force acts in a direction of distancing the joint part 6 from the insulating substrate 1. That is to say, the expansion force of peeling off the electrode 3 from the connection part 4 occurs. In the meanwhile, in the present embodiment 1, the joint part 6 is disposed outside the sealing member 5. The influence of the expansion force can be therefore suppressed, thus the reliability of the semiconductor device at the time of the temperature rise can be enhanced, and then the lifetime of the semiconductor device can be increased.

Modification Example

Figure 6:
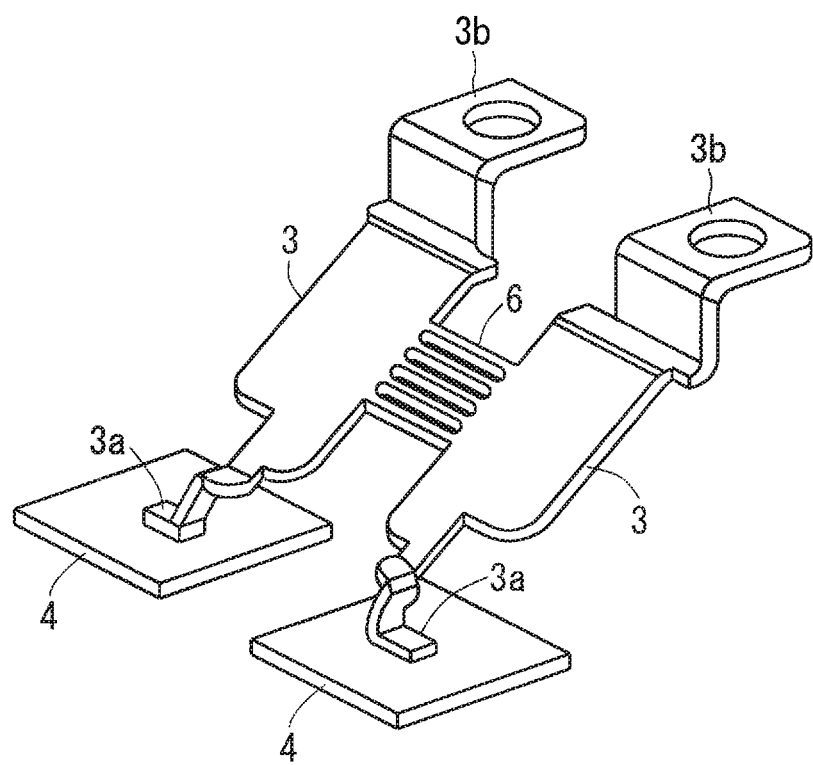
FIG. 6 A perspective view illustrating a configuration of a part of a semiconductor device according to a modification example.

The shape of the joint part 6 is not limited to the patternless long-plate shape as illustrated in FIG. 4 and FIG. 5. For example, as illustrated in FIG. 6 and FIG. 7, slits may be formed in the flat surface of the joint part 6. According to such a configuration, a possibility of operating the plurality of semiconductor chips equally and parallelly can be enhanced. When the number of slits is adjusted, the effect of obtaining the more appropriate electrical characteristics can be expected.

Figure 9:
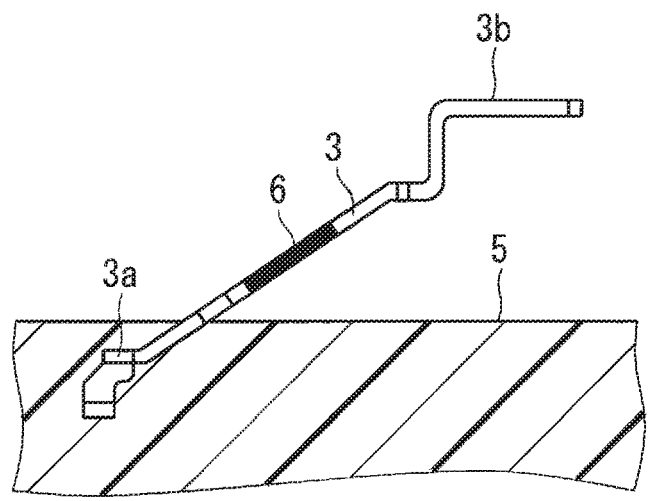
FIG. 9 A diagram of the configuration of the part of the semiconductor device according to the modification example seen from a side part of an electrode.

As illustrated in FIG. 8 and FIG. 9, the joint part 6 may have a wavelike shape having a constant width in a planar view. The planar view herein indicates that the joint part 6 is seen from an out-of-plane direction of the joint part 6. According to such a configuration, a movement (a difference of the movement) of the two electrodes 3 joined by the joint part 6 at the time of the thermal expansion can be reduced. As a result, stress applied to the connection part 4 can be reduced.

Figure 10:
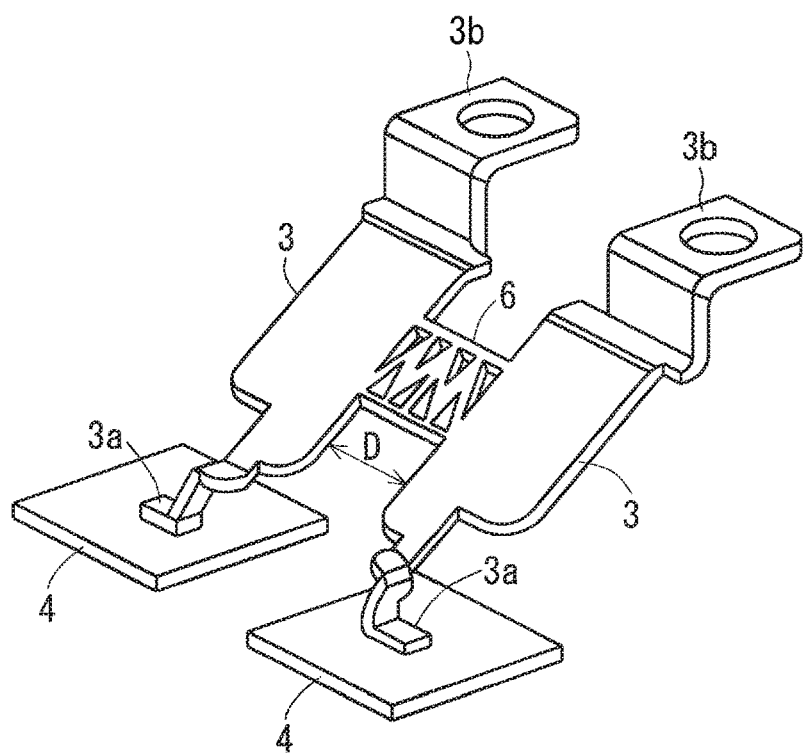
FIG. 10 A perspective view illustrating a configuration of a part of a semiconductor device according to a modification example.
Figure 11:
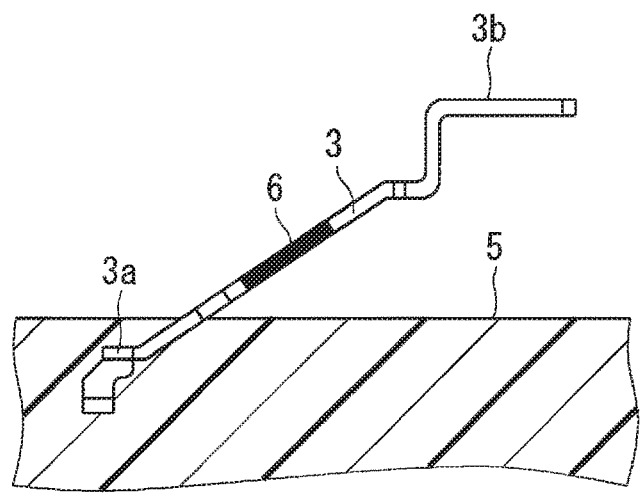
FIG. 11 A diagram of the configuration of the part of the semiconductor device according to the modification example seen from a side part of an electrode.

As illustrated in FIG. 10 and FIG. 11, the joint part 6 may have a truss shape in a planar view. According to such a configuration, a mechanical strength and flexibility of the joint part 6 can be enhanced. As a result, a distance D between the two electrodes 3 joined by the joint part 6 can be increased.

Figure 12:
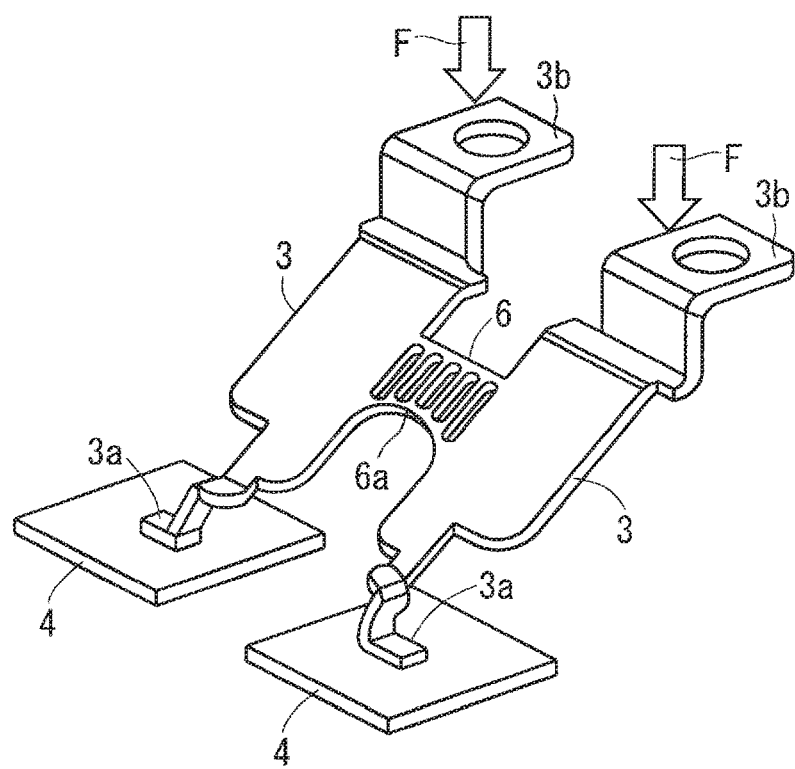
FIG. 12 A perspective view illustrating a configuration of a part of a semiconductor device according to a modification example.
Figure 13:
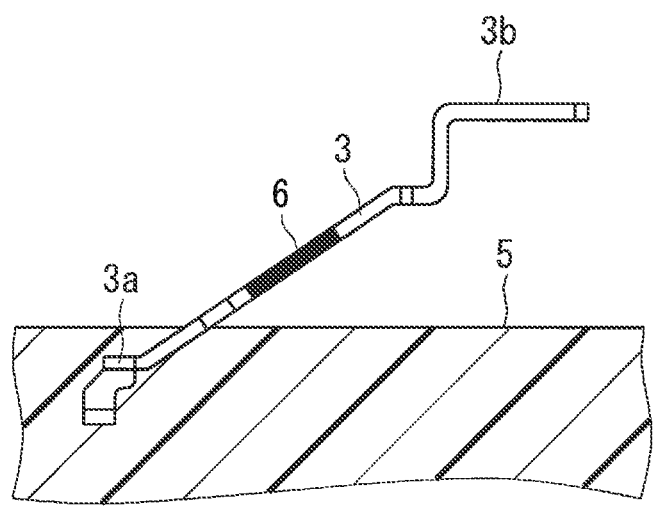
FIG. 13 A diagram of the configuration of the part of the semiconductor device according to the modification example seen from a side part of an electrode.

As illustrated in FIG. 12 and FIG. 13, for example, an outline of one end portion 6a on the sealing member 5 side (on the connection part 4 side) in both end portions which are not connected to the electrodes 3, in the joint part 6, may have a curved shape protruding toward an inner side of the joint part 6. That is to say, the joint part 6 may have an arch shape in a planar view. According to such a configuration, as illustrated in FIG. 13, for example, the electrode 3 can equally receive a load F caused by the electrical component such as the bus bar or the capacitor. As a result, a balance of the stress applied to the connection part 4 can be controlled.

According to the present invention, the above embodiments can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 2 semiconductor chip, 3 electrode, 5 sealing member, 6 joint part

The invention claimed is:

1. A semiconductor device, comprising:
a plurality of semiconductor chips;
a plurality of electrodes, each of the plurality of electrodes including a main portion and an end portion, each respective end portion being connected to a respective one of the plurality of semiconductor chips at a respective connection part, each main portion having a tapering shape that is tapered towards the connection part;
a sealing member covering the plurality of semiconductor chips and the connection part of each of the plurality electrodes; and
a joint part disposed outside the sealing member to electrically connect parts of the plurality of electrodes that are not covered by the sealing member, wherein
the tapering shape of the main portion of each electrode is between the end portion of the electrode and the joint part,
the plurality of electrodes and the joint part are made up of a single member,
the plurality of electrodes include no wire, and
the tapering shape of each main portion is asymmetric.

2. The semiconductor device according to claim 1, wherein
each connection part is entirely physically separated, by the sealing member, from any other connection part.

3. The semiconductor device according to claim 1, wherein
each end portion of each electrode extends at an approximately 90° angle from the respective main portion.

4. A semiconductor device, comprising:
a plurality of semiconductor chips;
a plurality of electrodes, each electrode including a main portion and an end portion, each end portion being directly bonded to a respective one of the plurality of semiconductor chips at a connection part, each main portion having a tapering shape that is tapered towards the connection part;
a sealing member covering the plurality of semiconductor chips and the connection part of each of the plurality electrodes; and
a joint part disposed outside the sealing member to electrically connect parts of the plurality of electrodes that are not covered by the sealing member, wherein
the tapering shape of the main portion of each electrode is between the end portion of the electrode and the joint part,
the plurality of electrodes and the joint part are made up of a single member,
the plurality of electrodes include no wire,
the joint part has a flat-plate shape,
the joint part is located between two of the plurality of electrodes adjacent to each other to connect the two of the plurality of electrodes, and
the tapering shape of each main portion is asymmetric.

5. The semiconductor device according to claim 4, wherein
a slit is formed in a flat surface of the joint part.

6. The semiconductor device according to claim 4, wherein
the joint part has a wavelike shape in a planar view.

7. The semiconductor device according to claim 4, wherein
the joint part has a truss shape in a planar view.

8. The semiconductor device according to claim 4, wherein
an outline of one end portion on the sealing member side in both end portions which are not connected to the plurality of electrodes, in the joint part, has a curved shape protruding toward an inner side of the joint part.

9. The semiconductor device according to claim 4, wherein
each end portion of each electrode extends at an approximately 90° angle from the respective main portion.

10. A semiconductor device, comprising:
a plurality of semiconductor chips mounted on an insulating substrate;
a sealing member covering the plurality of semiconductor chips;
a plurality of electrodes, each of the plurality of electrodes being plate-shaped and including a main portion and an end portion, each end portion being connected to a respective one of the plurality of semiconductor chips at a connection part, each main portion having a tapering shape that is tapered towards the respective connection part, so that the sealing member covers each connection part, and each electrode extending from a top surface of the respective one of the plurality of semiconductor chips to a region outside of the sealing member, the top surface being a surface of the semiconductor chip that is opposite to the insulating substrate; and
a joint part disposed outside the sealing member to electrically connect parts of the plurality of electrodes that are not covered by the sealing member, wherein
the plurality of electrodes and the joint part are made up of a single member,
the tapering shape of the main portion of each electrode is between the end portion of the electrode and the joint part, and
the tapering shape of each main portion is asymmetric.

11. The semiconductor device according to claim 10, wherein
the joint part has a flat-plate shape, and
the joint part is located between two of the plurality of electrodes adjacent to each other to connect the two of the plurality of electrodes.

12. The semiconductor device according to claim 11, wherein
a slit is formed in a flat surface of the joint part.

13. The semiconductor device according to claim 11, wherein
the joint part has a wavelike shape in a planar view.

14. The semiconductor device according to claim 11, wherein
the joint part has a truss shape in a planar view.

15. The semiconductor device according to claim 11, wherein
an outline of one end portion on the sealing member side in both end portions which are not connected to the plurality of electrodes, in the joint part, has a curved shape protruding toward an inner side of the joint part.

16. The semiconductor device according to claim 10, wherein
each connection part is entirely physically separated, by the sealing member, from any other connection part.

17. The semiconductor device according to claim 10, wherein
each end portion of each electrode extends at an approximately 90° angle from the respective main portion.

* * * * *